United States Patent
Zhao et al.

(10) Patent No.: US 9,461,537 B1
(45) Date of Patent: Oct. 4, 2016

(54) SYSTEMS AND METHODS FOR MEASURING INDUCTOR CURRENT IN A SWITCHING DC-TO-DC CONVERTER

(71) Applicant: Cirrus Logic, Inc., Austin, TX (US)

(72) Inventors: Xin Zhao, Austin, TX (US); Ku He, Austin, TX (US); John L. Melanson, Austin, TX (US); Xiaofan Fei, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 30 days.

(21) Appl. No.: 14/252,244

(22) Filed: Apr. 14, 2014

Related U.S. Application Data (60) Provisional application No. 61/811,859, filed on Apr. 15, 2013.

(51) Int. Cl.
*G05F 1/00* (2006.01)
*H02M 3/04* (2006.01)
*G01R 19/00* (2006.01)

(52) U.S. Cl.
CPC ............ *H02M 3/04* (2013.01); *G01R 19/0084* (2013.01)

(58) Field of Classification Search
CPC ........... H02J 3/18; H02J 3/1828; G05F 3/10; H02M 3/33507; H02M 3/33523; H02M 3/335; H02M 3/3523; Y02B 70/1433; Y10T 307/826

USPC ............... 323/285, 235, 205, 208, 209, 210; 363/21.03, 21.12

See application file for complete search history.

(56) References Cited

U.S. PATENT DOCUMENTS

| | | | |
|---|---|---|---|
| 7,872,461 B2 | 1/2011 | Yamada | |
| 8,067,929 B2 | 11/2011 | Huang et al. | |
| 8,125,805 B1 | 2/2012 | Melanson | |
| 8,242,813 B1 | 8/2012 | Wile et al. | |
| 2011/0074223 A1* | 3/2011 | Siniscalchi | H03K 17/164 307/115 |
| 2012/0019225 A1* | 1/2012 | Tsai | 323/284 |
| 2012/0153858 A1 | 6/2012 | Melanson et al. | |
| 2012/0194143 A1 | 8/2012 | Melanson | |
| 2013/0106375 A1* | 5/2013 | Marsili et al. | 323/282 |
| 2014/0132237 A1* | 5/2014 | Barnette | G05F 1/46 323/286 |

* cited by examiner

*Primary Examiner* — Jessica Han
*Assistant Examiner* — Lorena Bruner
(74) *Attorney, Agent, or Firm* — Jackson Walker L.L.P.

(57) ABSTRACT

A switch control circuit may be utilized for a sequence of switching events: a first event to activate a first switch and deactivate a second switch, wherein a current of an inductor coupled to the first switch and the second switch increases during the first event and has a positive value at an end of the first event; a second event to deactivate the first switch and activate the second switch, wherein the current of an inductor coupled to the first switch and the second switch decreases during the second event; and an impedance event during one of the first event and the second event such that during one of the first event and the second event, the impedance event causes an impedance of the one of the first switch and the second switch to decrease.

26 Claims, 6 Drawing Sheets

SYSTEMS AND METHODS FOR MEASURING INDUCTOR CURRENT IN A SWITCHING DC-TO-DC CONVERTER

RELATED APPLICATIONS

The present disclosure claims priority to U.S. Provisional Patent Application Ser. No. 61/811,859, filed Apr. 15, 2013, which is incorporated by reference herein in its entirety.

FIELD OF DISCLOSURE

The present disclosure generally relates to switching circuits, and, more particularly, to systems and methods for measuring an inductor current in a synchronous switching direct current-to-direct current (DC-DC) converter for converting a source of DC power supply from one voltage level to another voltage level.

BACKGROUND

Many electronic devices on the market today often use power converters to convert electric energy from one form to another (e.g., converting between alternating current and direct current), converting a voltage or current of an electrical signal, modifying a frequency of an electrical signal, or some combination of the above. Examples of power converters may include boost converters and buck converters. Such power converters are often used to convert an input voltage for other circuitry, wherein such converted voltage is greater than (e.g., if a boost converter is used) or less than (e.g., if a buck converter is used) the input voltage. A switching direct current-to-direct current (DC-DC) converter is a type of electronic circuit that converts a source of power from one DC voltage level to another DC voltage level. Examples of such switching DC-DC converters include but are not limited to a boost converter, a buck converter, a buck-boost converter, an inverting buck-boost converter, and other types of switching DC-DC converters.

Figure 1A:
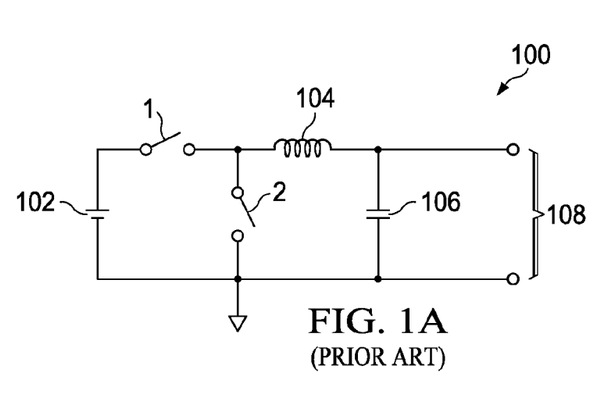
FIG. 1A illustrates an example synchronous switching DC-DC buck converter, as is known in the art.

FIG. 1A illustrates an example synchronous switching DC-DC buck converter 100, as is known in the art. Buck converter 100 may include a switch 1, a switch 2, an inductor 104, and a capacitor 106 coupled in the manner shown in FIG. 1A. When switch 1 is closed, an input voltage supply 102 may provide a DC voltage to inductor 104, and when switch 2 is closed, inductor 104 may discharge to a ground voltage. In typical operation, a switch control circuit controls the turn-on times and turn-off times of switches 1 and 2, and a current is maintained in inductor 104 to transfer energy from the input voltage supply 102 to the output voltage 108, such that output voltage 108 is smaller than the input voltage of input voltage supply 102.

Figure 1B:
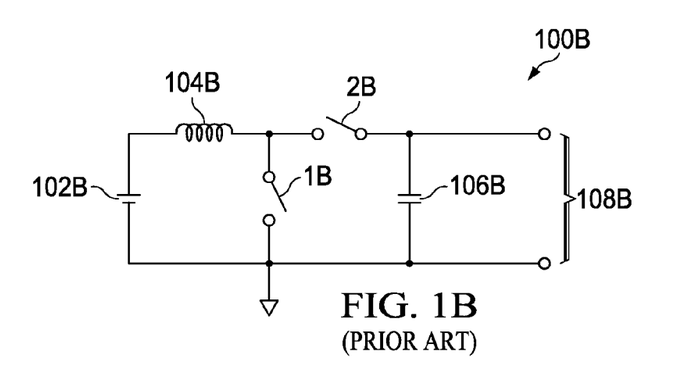
FIG. 1B illustrates an example synchronous switching DC-DC boost converter, as is known in the art.

FIG. 1B illustrates an example synchronous switching DC-DC boost converter 100B, as is known in the art. Boost converter 100B may include a switch 1B, a switch 2B, an inductor 104B, and a capacitor 106B coupled in the manner shown in FIG. 1B. An input voltage supply 102B may provide a DC input voltage to boost converter 100B, and in typical operation, a switch control circuit may control the turn-on times and turn-off times of switches 1B and 2B in order to maintain a current in inductor 104B to transfer energy from the input voltage 102B to the output voltage 108B, such that output voltage 108B is larger than the input voltage of input voltage supply 102B.

Figure 2A:
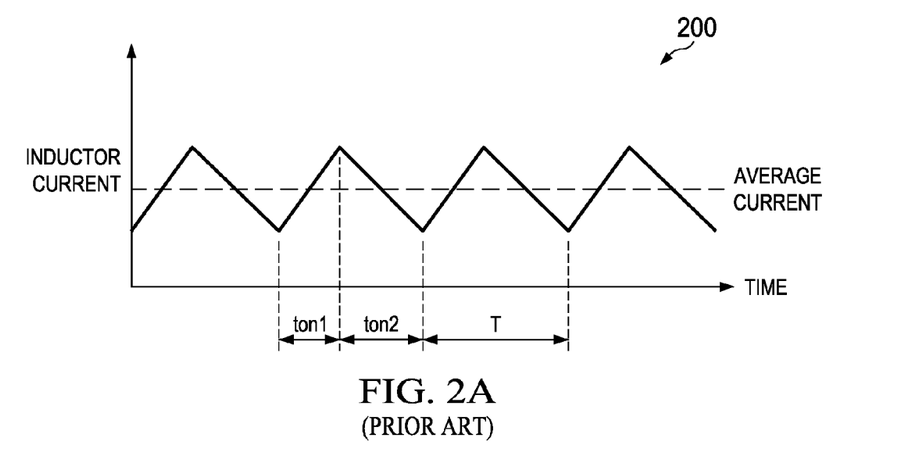
FIG. 2A illustrates an example inductor current waveform for a switching DC-DC converter operating in continuous conduction mode, as is known in the art.

FIG. 2A illustrates an example inductor current waveform 200 for switching DC-DC converter (e.g., converter 100, converter 100B) operating in continuous conduction mode ("CCM"), as is known in the art. As seen in FIG. 2A, the inductor current is periodic with a switching period T. To regulate an output voltage (e.g., 108), a switch control circuit causes a first switch (e.g., switch 1) to close for a time ton1 while causing a second switch (e.g., switch 2) to remain open, after which the switch control circuit causes the second switch to close for a time ton2 while causing the first switch to remain open, such that T=ton1+ton2. An output voltage Vout (e.g., output voltage 108) and an input voltage Vin (e.g., provided by input voltage source 102) may, in a buck converter, satisfy the relationship Vout/Vin=ton1/(ton1+ton2).

Figure 2B:
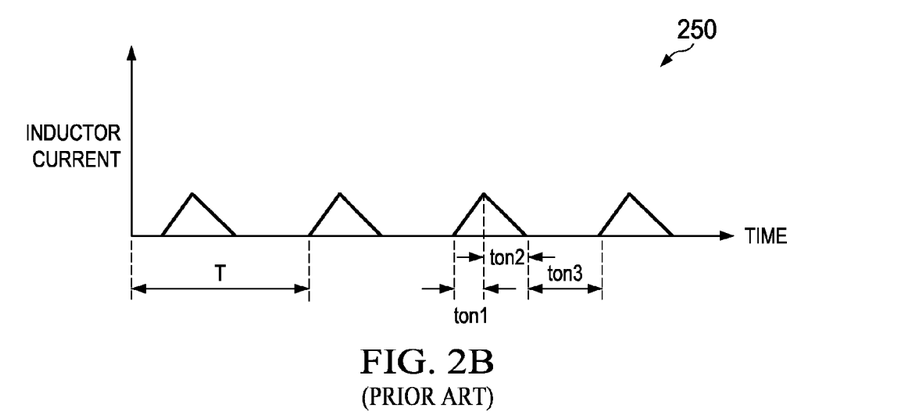
FIG. 2B illustrates an example inductor current waveform for a switching DC-DC converter operating in discontinuous conduction mode, as is known in the art.

FIG. 2B illustrates an example inductor current waveform 250 for switching DC-DC converter (e.g., converter 100, converter 100B) operating in discontinuous conduction mode ("DCM"), as is known in the art. As seen in FIG. 2B, the inductor current is periodic with a switching period T. To regulate an output voltage (e.g., 108), a switch control circuit causes a first switch (e.g., switch 1) to close for a time ton1 while causing a second switch (e.g., switch 2) to remain open, after which the switch control circuit causes the second switch to close for a time ton2 while causing the first switch to remain open, following which the switch control circuit causes both the first switch and the second switch to open for a time ton3 such that T=ton1+ton2+ton3. For each period T, time duration ton2 is controlled such that switch 2 is kept on until the inductor current decreases to zero and turns off when inductor current decreases to zero to prevent further decrease of the inductor current to a negative value. An output voltage Vout (e.g., output voltage 108) and an input voltage Vin (e.g., provided by input voltage source 102) may, in a buck converter, satisfy the relationship Vout/Vin=ton1/(ton1+ton2).

Figure 3:
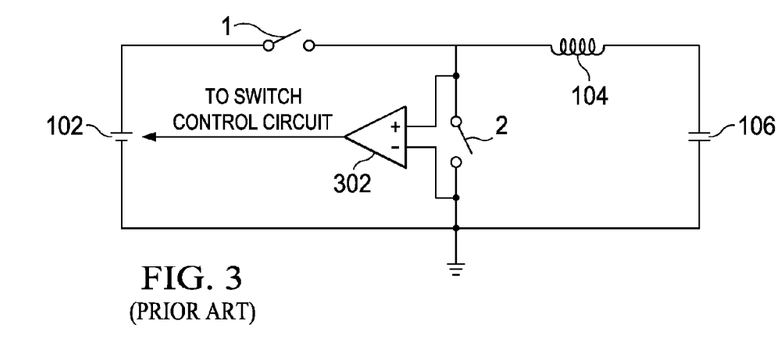
FIG. 3 illustrates an example switching DC-DC converter measurement topology, as is known in the art.

In order to correctly control switching of the switches shown in the converters of FIGS. 1A and 1B (e.g., buck converter 100 and boost converter 100B), and thus provide a desired output voltage (e.g., 108, 108B), the current through the inductor (e.g., 104, 104B) of the converter may need to be measured so that switches of the converter may be precisely controlled by the switch control circuit. In addition, measurement of current through the inductor of a converter may be used for other purposes, including compensation, operating mode detection, or inductor over-current detection. FIG. 3 depicts an example measurement technique, as is known in the art, detecting a zero crossing of an inductor current in a buck converter. Similar and analogous measurement techniques, although not illustrated herein, may also be applied to other types of converters, including a boost converter, buck-boost converter, and inverted buck-boost converter. As shown in FIG. 3, the inputs of a comparator 302 may be coupled to opposite terminals of switch 2, to measure a voltage across switch 2. In accordance with one existing approach to detect a zero crossing of inductor current, comparator 302 may monitor a voltage across switch 2 when switch 2 is closed, wherein such voltage is induced by a current flowing from inductor 104 through switch 2. If the voltage is positive, indicative of a current flowing from inductor 104 to ground via switch 2, comparator 302 may output a signal (e.g., a logical binary "1") indicating such positive voltage. On the other hand, if the voltage is negative, indicative of a current flowing from ground to inductor 104 via switch 2, comparator 302 may output a signal (e.g., a logical binary "0") indicating such negative voltage. A disadvantage of such approach is that it may require a high-precision, high-speed comparator 302. Due to what may be a small resistance of switch 2, the induced voltage drop across switch 2 may also be small, which may impose strict sensitivity requirements on comparator 302. Also, a delay of comparator 302 may cause a time difference between the zero crossing of the inductor current and switch 2 being opened by the switch control circuit. To minimize this time difference, a high-speed comparator may be required.

Another approach which may use the topology shown in FIG. 3 includes closing switch 2 for the duration ton2 and monitoring the output of comparator 302 after switch 2 is turned off. Because the resistance of the switch may be relatively high when it is open, the induced voltage drop across switch 2 may be significantly higher than when switch 2 is closed. Thus, the accuracy and speed requirements of comparator 302 for the approach described above may be alleviated. However, a disadvantage of the latter approach is that under certain conditions, opening switch 2 may stop the flow of inductor current, which may induce lower converter efficiency or cause incorrect operation.

SUMMARY

In accordance with the teachings of the present disclosure, certain disadvantages and problems associated with measuring an inductor current in a switching DC-DC converter may be reduced or eliminated.

In accordance with embodiments of the present disclosure, a method may include operating a DC-DC switch converter having a switch control circuit that controls a first switch and a second switch. The method may also include utilizing the switch control circuit for a sequence of switching events wherein the switching events are events that occur in an order of a first event and a second event for: performing the first event to activate the first switch and deactivate the second switch, wherein a current of an inductor coupled to the first switch and the second switch increases during the first event and has a positive value at an end of the first event; performing the second event to deactivate the first switch and activate the second switch, wherein the current of an inductor coupled to the first switch and the second switch decreases during the second event; and performing an impedance event during one of the first event and the second event such that at least one of the following occurs: (i) during the first event, the impedance event causes an impedance of the first switch to decrease from a first impedance to a second impedance; and (ii) during the second event, the impedance event causes an impedance of the second switch to increase from a third impedance to a fourth impedance. The method may further include measuring a voltage, the voltage comprising one of: a first voltage of the first switch while the first switch has the first impedance; and a second voltage of the second switch while the second switch has the fourth impedance.

In accordance with these and other embodiments of the present disclosure, a DC-DC switch converter may include a switch control circuit coupled to a first switch and a second switch for controlling the first switch and the second switch, an inductor coupled to the first switch and the second switch, a sensor coupled to the inductor for sensing a voltage, and a capacitor capable of being coupled in parallel with a load and coupled to the inductor wherein the capacitor provides an output for the DC-DC switch converter. The switch control circuit may utilize a sequence of switching events wherein the switching events are events that occur in an order of a first event and a second event for: performing the first event to activate the first switch and deactivate the second switch, wherein a current of an inductor coupled to the first switch and the second switch increases during the first event and has a positive value at an end of the first event; performing the second event to deactivate the first switch and activate the second switch, wherein the current of an inductor coupled to the first switch and the second switch decreases during the second event; and performing an impedance event during one of the first event and the second event such that at least one of the following occurs: (i) during the first event, the impedance event causes an impedance of the first switch to decrease from a first impedance to a second impedance; and (ii) during the second event, the impedance event causes an impedance of the second switch to increase from a third impedance to a fourth impedance. The sensor may be configured to measure a voltage, the voltage comprising one of a first voltage of the first switch while the first switch has the first impedance and a second voltage of the second switch while the second switch has the fourth impedance.

In accordance with these and other embodiments of the present disclosure, a method for measuring inductor current in a switch converter may include causing a variable-impedance switch of the switch converter to have a first impedance during a measurement phase while the variable-impedance switch is activated. The method may also in include causing the variable-impedance switch of the switch converter to have a second impedance substantially lower than the first impedance during an operation phase separate from the measurement phase while the switch is activated. The method may further include measuring a voltage of the variable-impedance switch during the measurement phase, wherein the voltage is indicative of the inductor current.

In accordance with these and other embodiments of the present disclosure, a switch converter may include a switch control circuit, an inductor, and a sensor. The switch control circuit may be coupled to a variable-impedance switch and may control the variable-impedance switch. The inductor may be coupled to the first switch and the second switch. The sensor may be coupled to the inductor for sensing a voltage indicative of a current of the inductor. The switch control circuit may be configured to cause the variable-impedance switch to have a first impedance during a measurement phase while the variable-impedance switch is activated and cause the variable-impedance switch to have a second impedance substantially lower than the first impedance during an operation phase separate from the measurement phase while the switch is activated. The sensor may be configured to measure a voltage of the variable-impedance switch during the measurement phase.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 4:
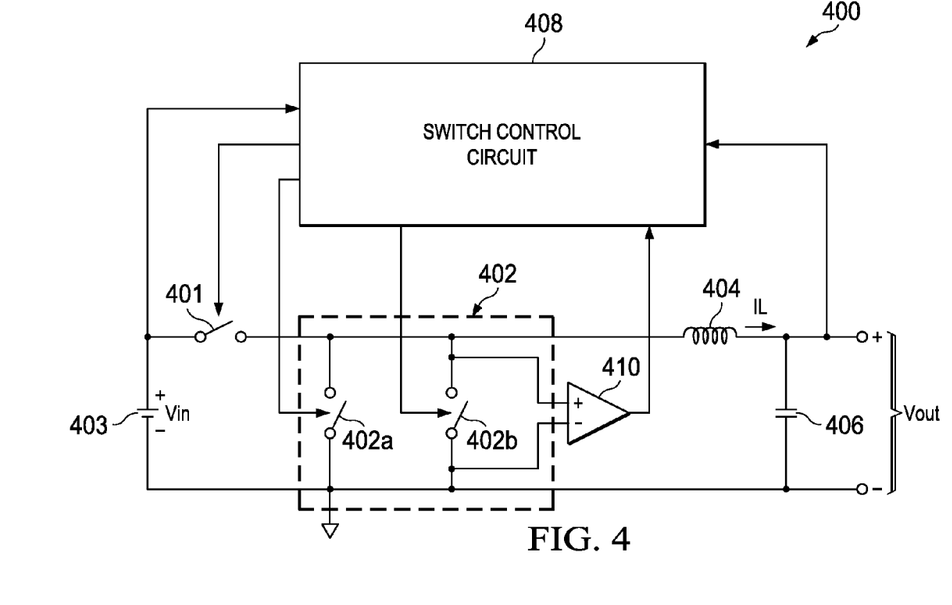
FIG. 4 illustrates an example synchronous switching DC-DC buck converter topology, in accordance with the present disclosure.
Figure 5:
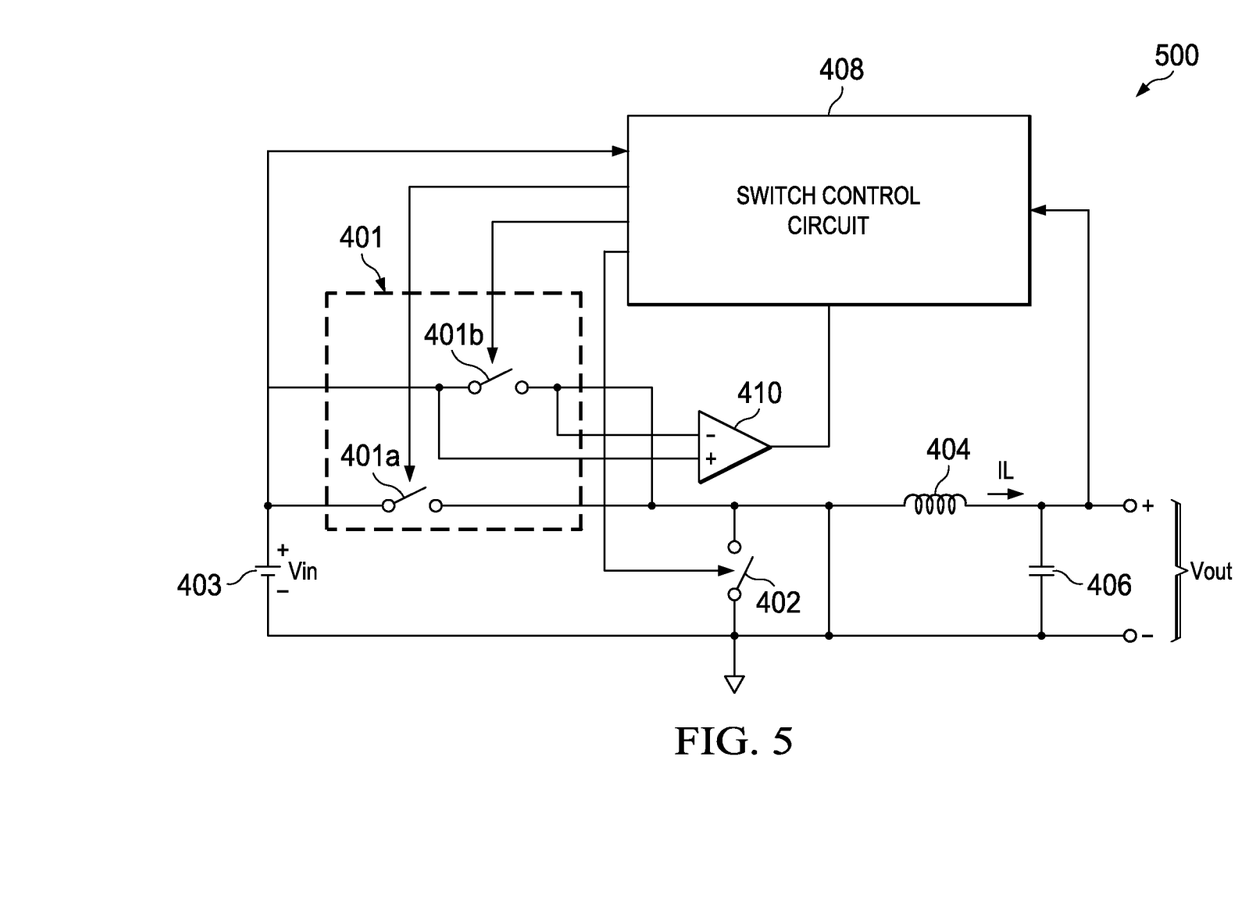
FIG. 5 illustrates another example synchronous switching DC-DC buck converter topology, in accordance with the present disclosure.
Figure 6:
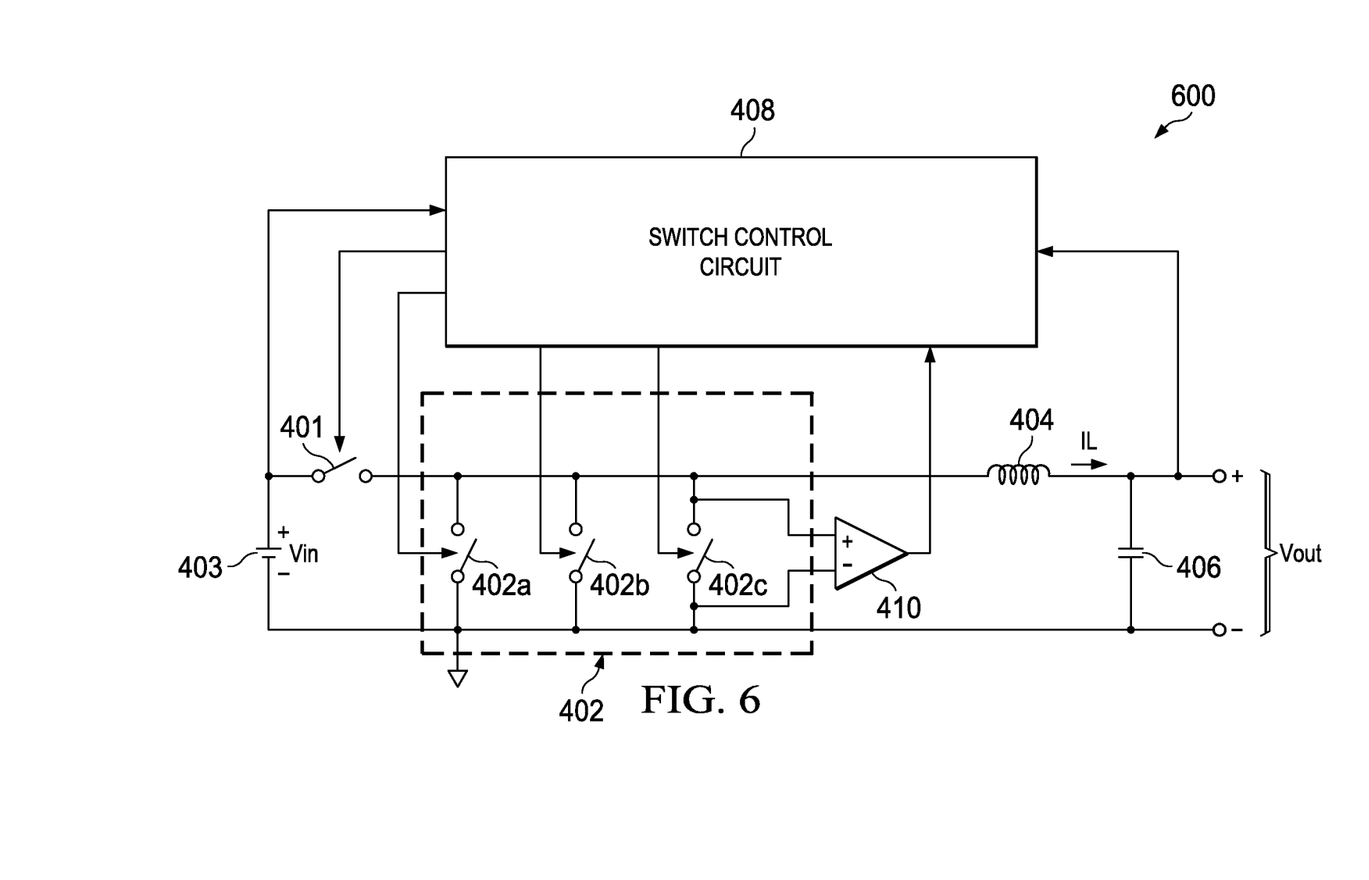
FIG. 6 illustrates yet another example synchronous switching DC-DC buck converter topology, in accordance with the present disclosure.
Figure 7A:
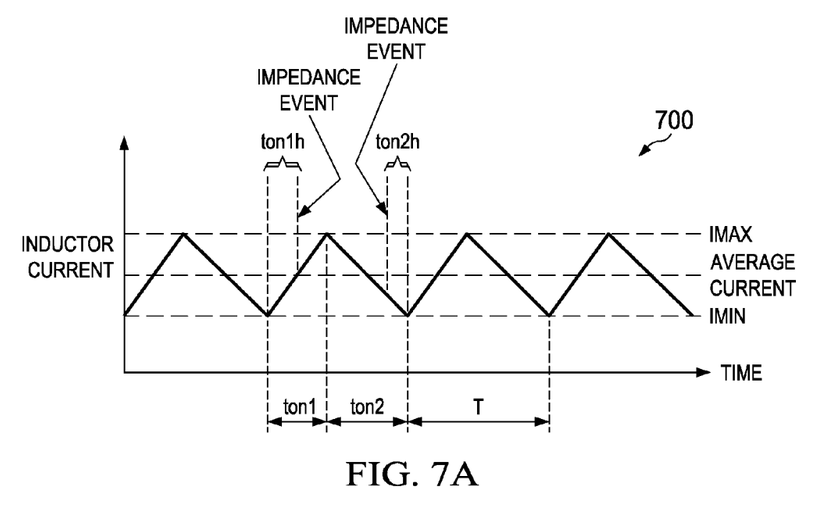
FIG. 7A illustrates an example inductor current waveform for a switching DC-DC converter operating in continuous conduction mode, in accordance with the present disclosure.
Figure 7B:
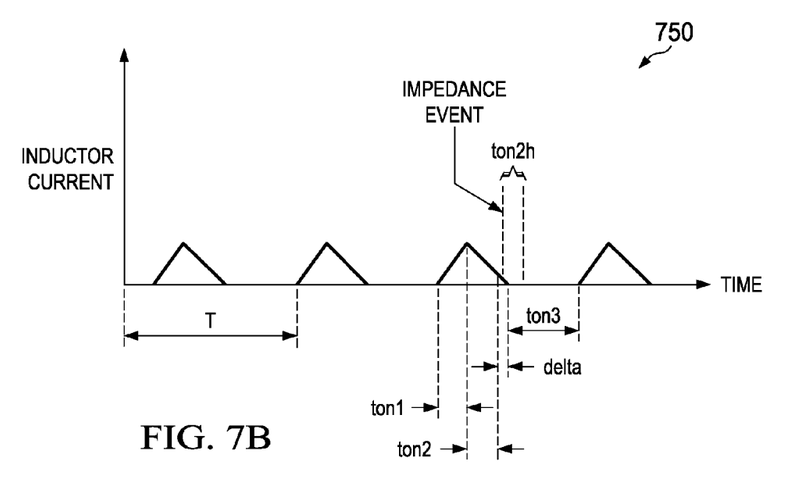
FIG. 7B illustrates an example inductor current waveform for a switching DC-DC converter operating in discontinuous conduction mode, in accordance with the present disclosure.

FIGS. 4-6 illustrate example synchronous switching DC-DC buck converter topologies 400, in accordance with the present disclosure. FIG. 7A illustrates example inductor current waveforms for the switching DC-DC converters depicted in FIGS. 4-6 operating in CCM and FIG. 7B illustrates example inductor current waveforms for the switching DC-DC converters depicted in FIGS. 4-6 operating in DCM.

Buck converter topology 400 may include a DC-DC buck converter comprising a switch 401, a variable-impedance switch 402 (e.g., comprising switching elements 402a and 402b), an inductor 404, a capacitor 406, and a comparator 410 coupled in the manner shown in FIG. 4. Buck converter topology 400 may also include an input voltage source 403 configured to provide an input voltage Vin to the buck converter, and a switch control circuit 408 configured to measure or determine a property (e.g., polarity, zero crossing time point, etc.) of an inductor current IL through inductor 404 in the direction of capacitor 406 and configured to control switches 401 and 402. In operation, switch control circuit 408 may cyclically deactivate (e.g., open) and activate (e.g. close) switches 401 and 402 and control the durations of time each switch 401 and 402 are deactivated and activated in order to maintain a current in inductor 404 to transfer energy from input voltage source 403 to capacitor 406, such that output voltage Vout is a DC voltage smaller than input voltage Vin provided by input voltage source 403.

As described above and elsewhere in this disclosure, switch control circuit 408 may be utilized to detect a zero crossing of inductor current IL based on an output of comparator 410. Although this disclosure contemplates operation of switch control circuit 408 with respect to the buck converter circuit of FIG. 4, identical, similar, or analogous operation may be used for switch control and current measurement of other converter circuits, including without limitation a boost converter, a buck-boost converter, and an inverted buck-boost converter.

As described above, switch 402 may comprise a variable-impedance switch. In some embodiments, switch 402 may comprise a plurality of switching elements 402a, 402b, etc., each of which may have different impedances. For example, in some embodiments, switching element 402a may have a small impedance while switching element 402b may have a large impedance. In operation, during a time period in which switch 402 is activated (e.g., during a period ton2 of decreasing inductor current depicted in FIGS. 7A and 7B), such time period may begin with both switching elements 402a and 402b activated, and during such time period, switch control circuit 408 may cause an impedance event, whereby the impedance of switch 402 may be increased for a duration ton2h (e.g., by deactivating switching element 402a while leaving switching element 402b activated). As used herein, an "impedance event" is an event whereby an impedance of a switch (e.g., switch 401, switch 402) is modified to increase or decrease upon occurrence of the impedance event. Accordingly, after the impedance event (e.g., during period ton2h), an impedance of switch 402 may be sufficiently large enough to allow comparator 410 to accurately measure a voltage across switch 402 (e.g., the voltage across switching element 402b) and communicate its output to switch control circuit 408, which may, based on the output of comparator 410, determine when current IL crosses zero. Buck converter topology 400 may be used to detect a zero crossing of inductor current IL when the converter is operating in DCM, may be used in CCM to detect the onset of DCM, or may be used in any other suitable manner.

FIG. 5 illustrates an example synchronous switching DC-DC buck converter topology 500, in accordance with the present disclosure. Buck converter topology 500 may be analogous to that of buck converter topology 400, except that switch 401 comprises a variable-impedance switch comprising switch elements 401a and 401b (each of which may have different impedances), switch 402 is a fixed-impedance switch, and comparator 410 is configured to measure a voltage across switch 401. Similar to some embodiments of buck converter topology 400, in some embodiments of buck converter topology 500, switching element 401a may have a small impedance while switching element 401b may have a large impedance. In operation, during a time period in which switch 401 is activated (e.g., during a period ton1 of increasing inductor current depicted in FIGS. 7A and 7B), such time period may begin with switching element 401b activated and switching element 401a activated for a period ton1h. During such time period ton1, switch control circuit 408 may cause an impedance event, whereby the impedance of switch 401 may be decreased (e.g., by activating both of switching elements 401a and 401b). Accordingly, prior to the impedance event (e.g., during period ton1h), an impedance of switch 401 may be sufficiently large enough to allow comparator 410 to accurately measure a voltage across switch 401 (e.g., the voltage across switching element 401b) and communicate its output to switch control circuit 408, which may, based on the output of comparator 410, determine when current IL crosses zero. Buck converter topology 500 may be used in CCM to detect the onset of DCM, or may be used in any other suitable manner.

Although FIGS. 4 and 5 respectively depict switches 402 and 401 comprising two switching elements, a switch 402 or 401 may comprise any suitable number of parallel switches. For example, FIG. 6 illustrates an example synchronous switching DC-DC buck converter topology 600 in which switch 402 comprises three switching elements, in accordance with the present disclosure. In buck converter topology 600, switch 402 may include switching elements 402a, 402b, and 402c, each having incrementally larger impedances. Thus, when it is desired to perform a measurement in CCM to detect the onset of DCM, switching element 402c may be deactivated while switching elements 402a and 402b are activated. In buck converter topology 600 having this configuration, the resistance of switch 402b may be selected to be small enough not to disturb the flow of current IL in CCM operation. When it is desired to perform a measurement DCM mode to detect a zero crossing, switching elements 402b and 402c may be deactivated while switching element 402a is activated. In this configuration, the impedance of switch 402a may be selected to be of a value sufficient enough to provide a desired level of sensitivity when detecting a zero crossing for inductor current IL.

The topologies described above, and variants thereof, may be used to detect a zero crossing event such that switch control circuit 408 may control the switching of switches 401 and 402 (e.g., the time periods ton1 and ton2 described with respect to FIGS. 7A and 7B), so as to generate a desired average inductor current and thus a desired output voltage Vout for a buck converter. For example, when operating in CCM as shown in FIG. 7A, switch control circuit 408 may cause an impedance event to happen during a time period ton2 which increases the impedance of switch 402 and may, during the period ton2 but after the impedance event (e.g., during a period ton2h shown in FIG. 7A), monitor the output of comparator 410 to determine if and when inductor current IL crosses zero. As another example, when operating in CCM as shown in FIG. 7A, switch control circuit 408 may cause an impedance event to happen during a time period ton1 which decreases the impedance of switch 401 and may, during the period ton1 but before the impedance event (e.g., during a period ton1h shown in FIG. 7A), monitor the output of comparator 410 to determine if and when inductor current IL crosses zero.

In CCM, power loss due to resistance of a variable impedance switch 401 or 402 may equal $(4 \times Iavg^2 - Imax \times Imin) \times R/3$, where Iavg is the average inductor current within period T; Imax is the maximum inductor current within period T; Imin is the minimum inductor current within period T; and R is the resistance of switch 401 after an impedance event occurring during period ton1 or that of switch 402 before an impedance event during period ton2. If an impedance event occurs during period ton1h, the added power loss due to increased impedance of switch 401 during period ton1h may equal $Imin^2 \times R1h \times ton1h/T$, where R1h is the resistance of switch 401 before the impedance event. If an impedance event occurs during period ton2h, the added power loss due to increased impedance of switch 402 after the impedance event may be $Imin^2 \times R2h \times ton2h/T$, where R2h is the resistance of switch 402 after the impedance event. Because the switch 401 or 402 is in the high impedance state when the inductor current is close to the minimum inductor current Imin, the power loss due to increased impedance of switch 401 or 402 is minimized.

Comparator 410 or another measuring circuit may measure voltage across switch 401 during period ton1h, before the impedance event, or it may measure voltage across switch 402 during period ton2h, after the impedance event. Either of period ton1h or period ton2h may be chosen to be long enough for the measuring circuits to accurately complete a measurement of voltage across switch 401 or switch 402, as applicable. For example, such time periods may be chosen to satisfy $ton1h \ll 4 \times T \times R/R1h$ or $ton2h \ll 4 \times T \times R/R2h$, so that the added power loss due to increased impedance of switch 401 period during ton1h before the impedance event or due to that of switch 402 during period ton2h after the impedance event is insignificant. An example selection of resistances and time duration may be R1h=10R and ton1h=0.04T or R2h=10R and ton2h=0.04T.

As another example, when operating in DCM, switch control circuit 408 may maintain durations of time period ton1, ton2, and ton3 described with respect to FIG. 7B so as to generate a desired average inductor current and thus a desired output voltage Vout for a buck converter. In some embodiments, switch control circuit 408 may control and vary the durations ton1 and ton2 such that a desired amount of current is delivered and a desired output voltage Vout is maintained. In such embodiments, switch control circuit 408 may maintain time period ton3 as a constant. Further, switch control circuit 408 may control the duration of times ton1 and ton2 such that ton2=r×ton1+delta−ton3, wherein r is a constant based on a ratio of input voltage Vin and output voltage Vout, and delta is an adaptive variable that is adapted based on whether a zero crossing for current IL is detected during a time period T. Switch control circuit 408 may cause an impedance event to happen during time period ton2 which increases the impedance of switch 402 and may, during the period ton2 but after the impedance event and during period ton3 (e.g., during period ton2h), monitor the output of comparator 410 to determine if and when inductor current IL crosses zero. Switch control circuit 408 may calculate a new value of the variable delta in each switching period T of the converter. If comparator 410 measures inductor current IL to be less than zero at the end of the ton2 period, the value of delta may be set to a predetermined positive number. In this case, period ton2 may increase, and inductor current IL may become smaller at the end of period ton2. If comparator 410 measures inductor current IL to be above zero at the end of the ton2 period, the value of delta may be set to a predetermined negative number. In this case, period ton2 may decrease, and inductor current IL may become larger at the end of period ton2. Accordingly, as a result of this adaptation, inductor current IL may approach zero at the end of period ton2, which is often a desired result in DCM operation.

In DCM, power loss due to resistance of switch 402 may equal $Vout^2 \times ton2h^3 \times Vin \times R/(3 \times T \times L^2 \times (Vin-Vout))$ where R is the resistance of switch 402 before an impedance event during period ton2, and L is an inductance of inductor 404. The added power loss due to the increased impedance of switch 402 after the impedance event during ton2 is $Vout^2 \times ton2h^3 \times R2h/(3 \times T \times L^2)$. Period ton2h may be chosen to be long enough for comparator 410 and/or other measuring circuits to complete a measurement of the voltage across switch 402, and in some embodiments may satisfy $ton2h \ll ton2 \times (\sqrt[3]{R}/\sqrt[3]{R2h})$, so that added power loss due to increased impedance of switch 402 after the impedance event (e.g., during ton2h) is insignificant. An example selection of resistance and time duration may be R2h=10R, and ton2h=0.4×ton2.

Stated in a more general fashion, a switch control circuit (e.g., switch control circuit 408) may control switches (e.g., switches 401 and 402) in a DC-DC switch converter (e.g., buck converter, boost converter, etc.) to operate the converter in a sequence of switching events wherein the switching events are events that occur in an order of a first event and a second event. During the first event, the switch control circuit may activate the first switch and deactivate the second switch, such that a current (e.g., IL) of an inductor (e.g., inductor 404) coupled to the first switch and the second switch increases during the first event and has a positive value at an end of the first event (e.g., corresponding to time period ton1). During the second event, the switch control circuit may deactivate the first switch and activate the second switch, wherein the current of an inductor coupled to the first switch and the second switch decreases during the second event (e.g., corresponding to time period ton2). During at least one of the first event or the second event (e.g., during at least one of time periods ton1 and ton2), the switch control circuit may perform an impedance event. If occurring during the first event, the impedance event may cause an impedance of the first switch to decrease from a first impedance to a second impedance (e.g., during a period ton1h). For example, the first switch may include a first switching element (e.g., 401b) and a second switching element (e.g., 401a) with an impedance lesser than that of the first switching element, such that during the first event, the switch control circuit activates the first switching element prior to and after the impedance event, deactivates the second switching element prior to the impedance event, and activates the second switching element following the impedance event. If occurring during the second event, the impedance event may cause an impedance of the second switch to increase from a third impedance to a fourth impedance (e.g., during a period ton2h). For example, the second switch may include a first switching element (e.g., 402b) and a second switching element (e.g., 402a) with an impedance lesser than that of the first switching element, such that during the second event, the switching control circuit activates the first switching element prior to and after the impedance event, activates the second switching element prior to the impedance event, and deactivates the second switching element following the impedance event.

A comparator (e.g., comparator 410) or other circuitry may measure a voltage, such that the voltage includes one of a first voltage of the first switch while the first switch has the first impedance (e.g., during period ton1h, before the impedance event) and a second voltage of the second switch while the second switch has the fourth impedance (e.g., during period ton2h, after the impedance event). Based on the comparator output, the switch control circuit may determine when the current decreases to a value below zero based on the voltage, wherein a zero crossing time point is defined based on when the current reaches zero. The switch control circuit may control a duration of at least one of the first event (e.g., ton1) and the second event (e.g., ton2) based on the zero crossing time point.

In DCM, the switch control circuit may provide a third event having a duration ton3 occurring after the second event, in which the control circuit deactivates the first switch and the second switch. For each switch period of the controller, the switch control circuit may control a duration of time of either or both of the first event (e.g., ton1) or the second event (e.g., ton2) to satisfy the equation ton2=r× ton1+delta−ton3, wherein r is a constant based on a ratio of an input voltage (e.g., Vin) of the switch converter to an output voltage (e.g., Vout) of the switch converter, and delta is an adaptive variable that is adapted based on measurement of the voltage. If the voltage across the switch is positive, the value of delta may be decreased by a predetermined amount, while if the voltage across the switch is negative, the value of delta may be increased by a predetermined amount. Each new calculated value for delta may then be used in the next switching period of the converter.

By employing variable-impedance switches as described herein, a converter may be constructed wherein a switch in a converter may have a high impedance during a measurement phase while the switch is activated wherein a voltage of a switch is measured, thus permitting greater sensitivity in measurements, while providing a low impedance during an operation phase separate from the measurement phase while the switch is activated, thus minimizing power loss when measurements are not being made. In some embodiments, such measurement may be taken to determine a zero-crossing point of a current through the variable-impedance switch. Thus, the converter may be constructed such that a switch has a higher impedance at lower currents and a lower impedance at higher currents.

As used herein, when two or more elements are referred to as "coupled" to one another, such term indicates that such two or more elements are in electronic communication whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosures have been described in detail, it should be understood that various changes, substitutions, and alterations could be made hereto without departing from the spirit and scope of the disclosure.

What is claimed is:

1. A method of operating a direct current-to-direct current (DC-DC) switch converter, comprising:
   operating the DC-DC switch converter having a switch control circuit that controls a first switch and a second switch;
   utilizing the switch control circuit for a sequence of switching events wherein the switching events are events that occur in an order of a first event and a second event for:
   performing the first event to activate the first switch and deactivate the second switch, wherein a current of an inductor coupled to the first switch and the second switch increases during the first event and has a positive value at an end of the first event;
   performing the second event to deactivate the first switch and activate the second switch, wherein the current of an inductor coupled to the first switch and the second switch decreases during the second event; and
   performing an impedance event during one of the first event and the second event such that at least one of the following occurs:

during the first event, the impedance event causes an impedance of the first switch to decrease from a first impedance to a second impedance; and during the second event, the impedance event causes an impedance of the second switch to increase from a third impedance to a fourth impedance; and measuring a voltage, the voltage comprising one of:
a first voltage of the first switch while the first switch has the first impedance; and
a second voltage of the second switch while the second switch has the fourth impedance.

2. The method of claim 1, further comprising determining when the current decreases to a value below zero based on the voltage, wherein a zero crossing time point is defined based on when the current reaches zero.

3. The method of claim 2, wherein the first switch comprises a first switching element and a second switching element, and wherein during the first event, the first switching element is activated prior to and after the impedance event, the second switching element is deactivated prior to the impedance event, and the second switching element is activated following the impedance event.

4. The method of claim 3, wherein the first switching element has an impedance greater than an impedance of the second switching element.

5. The method of claim 2, wherein the second switch comprises a first switching element and a second switching element, and wherein during the second event, the first switching element is activated prior to and after the impedance event, the second switching element is activated prior to the impedance event, and the second switching element is deactivated following the impedance event.

6. The method of claim 5, wherein the first switching element has an impedance greater than an impedance of the second switching element.

7. The method of claim 6, further comprising utilizing the switch control circuit to control a duration of future occurrences of at least one of the first event and the second event based on the zero crossing time point.

8. The method of claim 2, further comprising utilizing the switch control circuit for a sequence of switching events wherein the switching events also comprise a third event, and the switching events are events that occur in an order of the first event, the second event, and the third event for:
performing the third event to deactivate the first switch and deactivate the second switch.

9. The method of claim 8, further comprising during each period of the switching events comprising the first event, the second event, and the third event:
controlling a duration of time of the second event to satisfy the equation Ton2=r×Ton1+delta−Ton3, wherein Ton2 is the duration of time of the second event, Ton1 is a duration of time of the first event, Ton3 is a duration of time of the third event, r is a constant based on a ratio of an input voltage of the DC-DC switch converter to an output voltage of the DC-DC switch converter, and delta is an adaptive variable that is adapted based on measurement of the voltage.

10. A direct current-to-direct current (DC-DC) switch converter, comprising:
a switch control circuit coupled to a first switch and a second switch for controlling the first switch and the second switch;
an inductor coupled to the first switch and the second switch;
a sensor coupled to the inductor for sensing a voltage; and
a capacitor capable of being coupled in parallel with a load and coupled to the inductor wherein the capacitor provides an output for the DC-DC switch converter;
wherein the switch control circuit utilizes a sequence of switching events wherein the switching events are events that occur in an order of a first event and a second event for:
performing the first event to activate the first switch and deactivate the second switch, wherein a current of an inductor coupled to the first switch and the second switch increases during the first event and has a positive value at an end of the first event;
performing the second event to deactivate the first switch and activate the second switch, wherein the current of an inductor coupled to the first switch and the second switch decreases during the second event; and
performing an impedance event during one of the first event and the second event such that at least one of the following occurs:
during the first event, the impedance event causes an impedance of the first switch to decrease from a first impedance to a second impedance; and
during the second event, the impedance event causes an impedance of the second switch to increase from a third impedance to a fourth impedance;
wherein the sensor is configured to measure a voltage, the voltage comprising one of:
a first voltage of the first switch while the first switch has the first impedance; and
a second voltage of the second switch while the second switch has the fourth impedance.

11. The converter of claim 10, wherein the switch control circuit is further configured to determine when the current decreases to a value below zero based on the voltage, wherein a zero crossing time point is defined based on when the current reaches zero.

12. The converter of claim 11, wherein the first switch comprises a first switching element and a second switching element, and wherein during the first event, the first switching element is activated prior to and after the impedance event, the second switching element is deactivated prior to the impedance event, and the second switching element is activated following the impedance event.

13. The converter of claim 11, wherein the first switching element has an impedance greater than an impedance of the second switching element.

14. The converter of claim 11, wherein the second switch comprises a first switching element and a second switching element, and wherein during the second event, the first switching element is activated prior to and after the impedance event, the second switching element is activated prior to the impedance event, and the second switching element is deactivated following the impedance event.

15. The converter of claim 14, wherein the first switching element has an impedance greater than an impedance of the second switching element.

16. The converter of claim 11, wherein the switch control circuit further controls a duration of a future occurrence of at least one of the first event and the second event based on the zero crossing time point.

17. The converter of claim 11, wherein the sequence of switching events also comprise a third event, and the switching events are events that occur in an order of the first event, the second event, and the third event for:
performing the third event to deactivate the first switch and deactivate the second switch.

18. The converter of claim 17, wherein the switch control circuit is further configured to, during each period of the switching events comprising the first event, the second event, and the third event:

control a duration of time of the second event to satisfy the equation Ton2=r×Ton1+delta−Ton3, wherein Ton2 is the duration of time of the second event, Ton1 is a duration of time of the first event, Ton3 is a duration of time of the third event, r is a constant based on a ratio of an input voltage of the DC-DC switch converter to an output voltage of the DC-DC switch converter, and delta is an adaptive variable that is adapted based on measurement of the voltage.

19. A method for measuring an inductor current of an inductor in a switch converter, comprising:

causing a variable-impedance switch of a switch converter, wherein the variable-impedance switch is coupled to the inductor, to be activated during a first period and deactivated during a second period;

causing the variable-impedance switch of the switch converter to have a first impedance during a measurement phase during the first period;

causing the variable-impedance switch of the switch converter to have a second impedance substantially lower than the first impedance during an operation phase during the first period and separate from the measurement phase wherein inductor current during the operation phase is greater than the inductor current during the measurement phase; and measuring a voltage of the variable-impedance switch during the measurement phase, wherein the voltage is indicative of the inductor current.

20. The method of claim 19, wherein the variable-impedance switch comprises a first switching element and a second switching element, and wherein:

during the measurement phase, the first switching element is activated and the second switching element is deactivated; and during the operation phase, the second switching element is activated.

21. The method of claim 20, wherein the first switching element has an impedance greater than an impedance of the second switching element.

22. The method of claim 19, wherein the inductor current is of lower magnitude during the measurement phase than it is during the operation phase.

23. A switch converter, comprising:

a switch control circuit coupled to a variable-impedance switch controlling the variable-impedance switch;

an inductor coupled to the variable-impedance switch; and a sensor coupled to the inductor for sensing a voltage indicative of a current of the inductor;

wherein the switch control circuit is configured to:

cause the variable-impedance switch of a switch converter to be activated during a first period and deactivated during a second period;

cause the variable-impedance switch to have a first impedance during a measurement phase during the first period; and cause the variable-impedance switch to have a second impedance substantially lower than the first impedance during an operation phase during the first period and separate from the measurement phase wherein the inductor current during the operation phase is greater than the inductor current during the measurement phase; and wherein the sensor is configured to measure a voltage of the variable-impedance switch during the measurement phase.

24. The switch converter of claim 23, wherein the variable-impedance switch comprises a first switching element and a second switching element, and wherein:

during the measurement phase, the switch control circuit activates the first switching element and deactivates the second switching element; and during the operation phase, the switch control activates the second switching element.

25. The switch converter of claim 24, wherein the first switching element has an impedance greater than an impedance of the second switching element.

26. The switch converter of claim 23, wherein the inductor current is of lower magnitude during the measurement phase than it is during the operation phase.

* * * * *